United States Patent [19]

Kaneko et al.

[11] 4,298,120

[45] Nov. 3, 1981

[54] CHIP-LIKE ELECTRONIC COMPONENT SERIES AND METHOD FOR SUPPLYING CHIP-LIKE ELECTRONIC COMPONENTS

[75] Inventors: Fumihiko Kaneko; Koichi Nitta; Kouichi Saito, all of Takefu, Japan

[73] Assignee: Murata Manufacturing Co., Ltd., Japan

[21] Appl. No.: 98,325

[22] Filed: Nov. 29, 1979

[30] Foreign Application Priority Data

Dec. 26, 1978 [JP] Japan ................................ 53-163580
Dec. 26, 1978 [JP] Japan ................................ 53-163581
Dec. 26, 1978 [JP] Japan ................................ 53-163582
Jan. 9, 1979 [JP] Japan ................................ 54-2471
Jan. 18, 1979 [JP] Japan ................................ 54-5100

[51] Int. Cl.³ .................. B65D 73/02; B65D 75/22; B65D 85/30
[52] U.S. Cl. .................. 206/329; 206/332; 206/389; 206/460; 206/634
[58] Field of Search ............... 206/329, 330, 332, 328, 206/389, 499, 390, 460, 634; 220/23.8

[56] References Cited

U.S. PATENT DOCUMENTS

| | | | |
|---|---|---|---|
| 2,372,072 | 3/1945 | Flaws, Jr. ............................ | 206/330 |
| 3,285,405 | 11/1966 | Wanderer ............................ | 206/499 |
| 3,469,686 | 9/1969 | Gutche et al. ...................... | 206/332 |
| 3,695,414 | 10/1972 | Weisler et al. ..................... | 206/328 |
| 3,858,721 | 1/1975 | Boyer et al. ........................ | 206/389 |

Primary Examiner—William T. Dixson, Jr.
Attorney, Agent, or Firm—Ostrolenk, Faber, Gerb & Soffen

[57] ABSTRACT

A chip-like electronic component series comprises a tape-like member formed with a plurality of apertures arranged in the longitudinal direction for receiving one by one a plurality of chip-like electronic components, cover sheets adhered to both surfaces of the tape-like member for sealing the apertures, and feeding perforations formed equispaced in the longitudinal direction of the tape-like member. The chip-like electronic component series is fed by using the feeding perforations, and the chip-like electronic components are supplied therefrom onto a print circuit board, for example, by stripping the upper cover and by pushing the electronic components one by one onto the print circuit board while the lower cover sheet is broken, by picking up the electronic components therefrom one by one, or the like to place the same onto the print circuit board.

26 Claims, 26 Drawing Figures

U.S. Patent  Nov. 3, 1981  Sheet 1 of 5  4,298,120
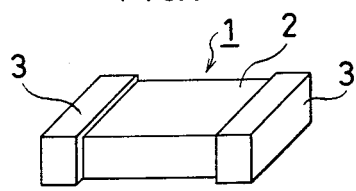
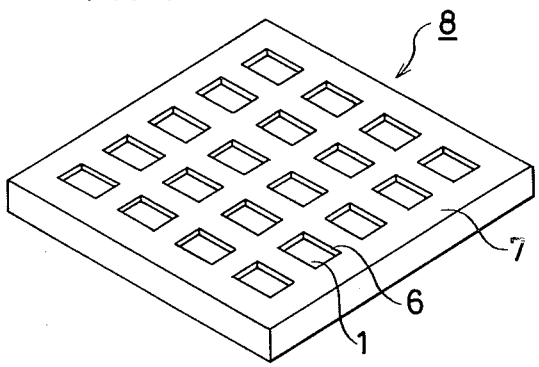
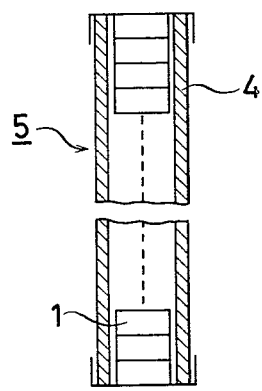
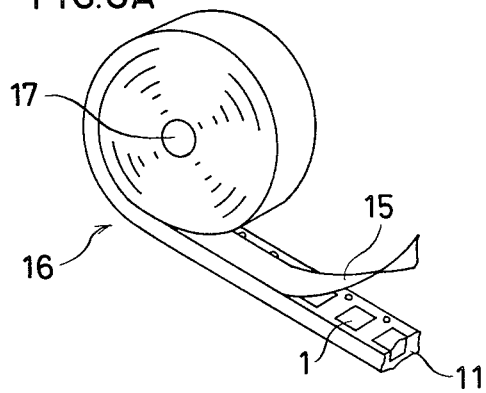
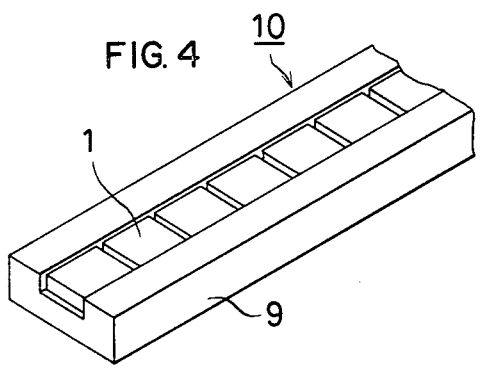
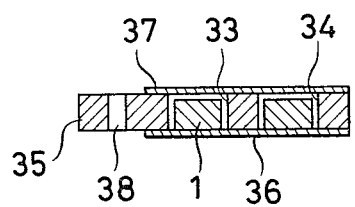

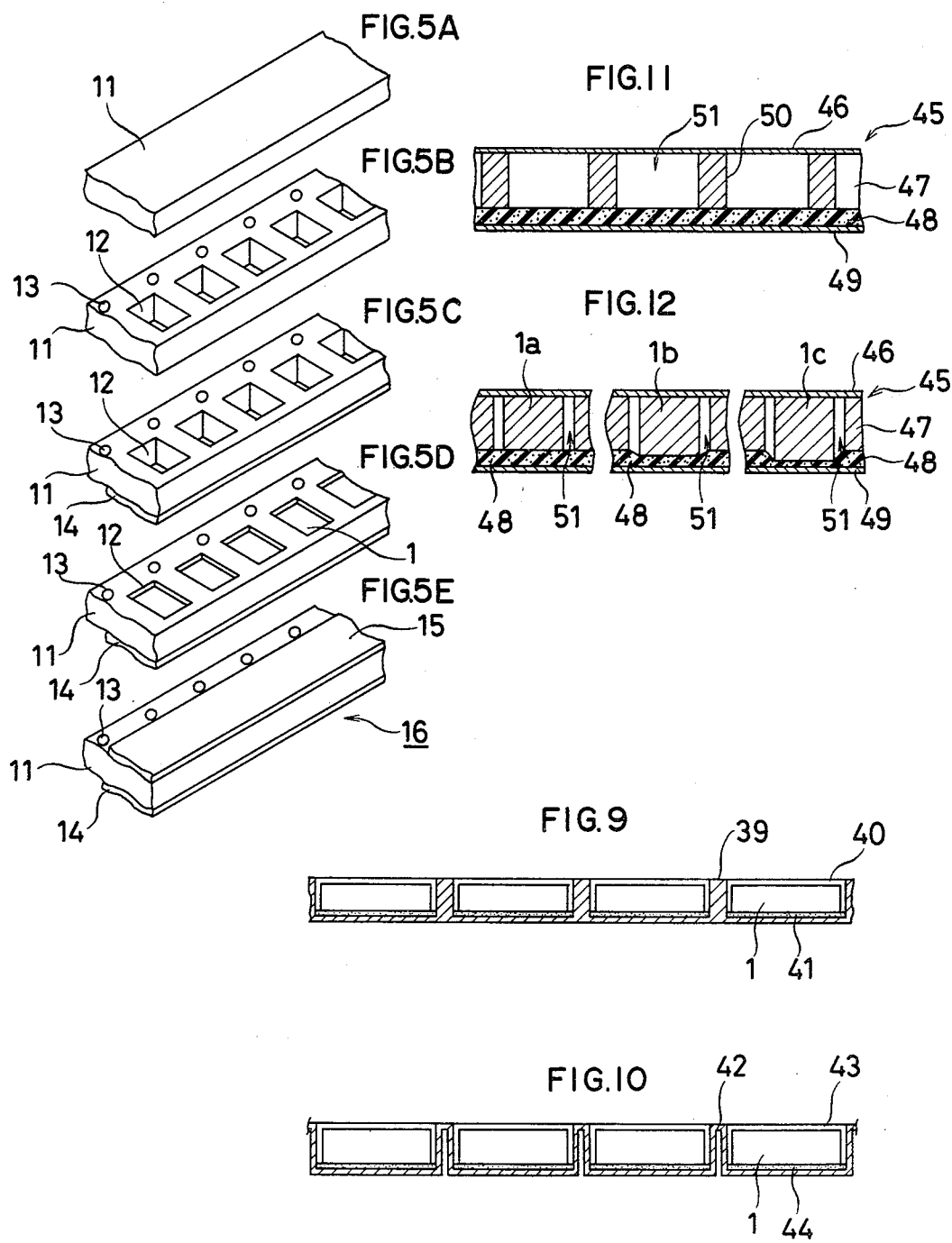

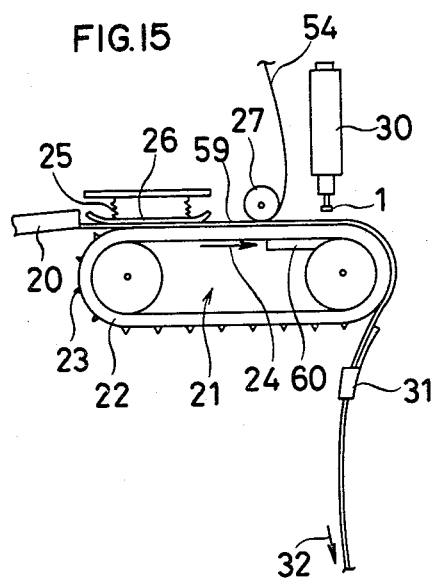
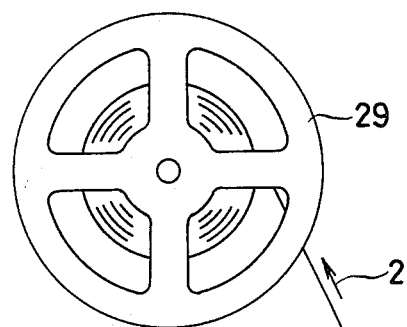
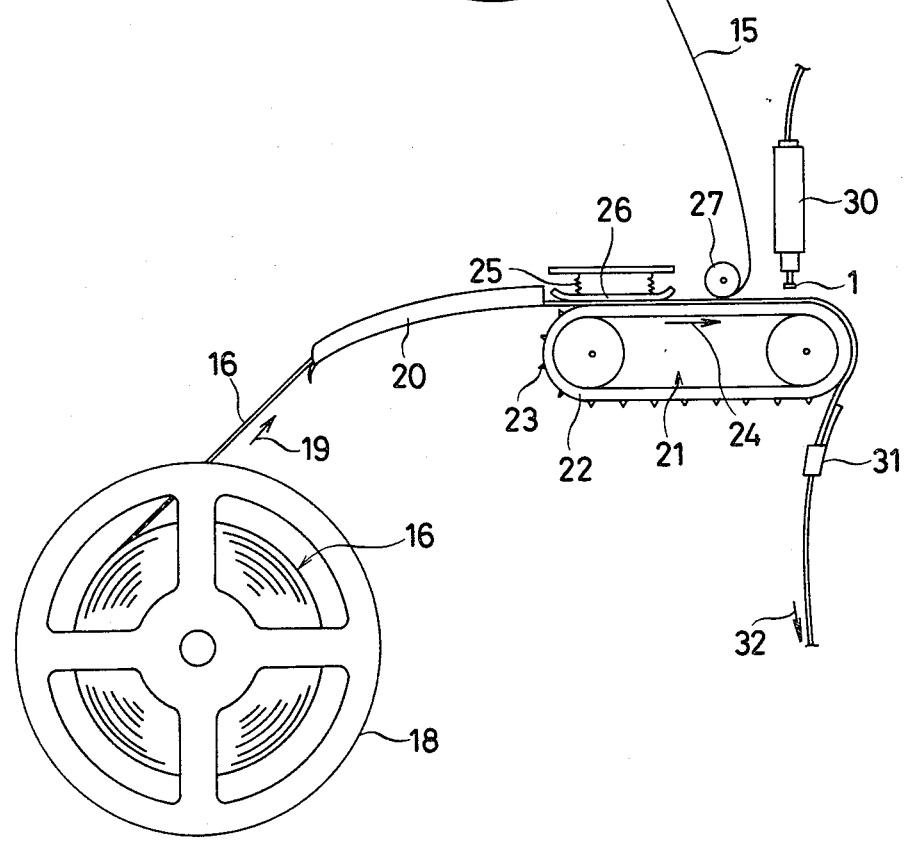

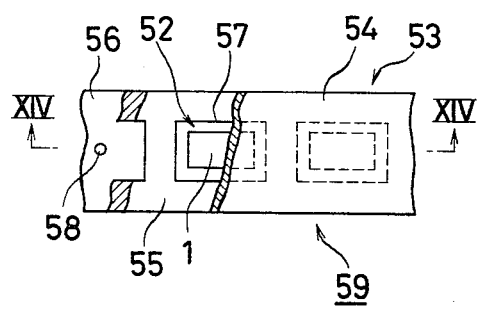
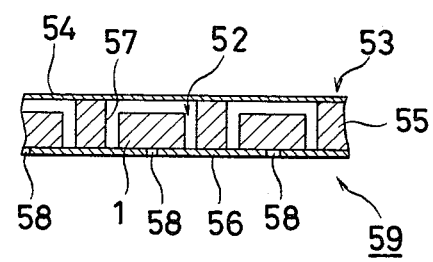
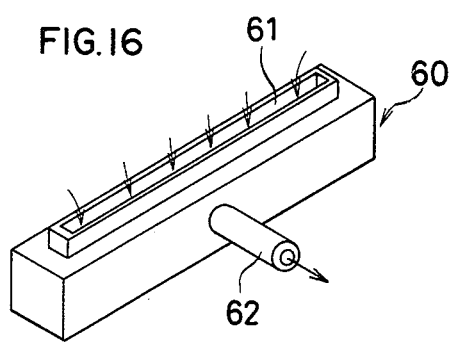
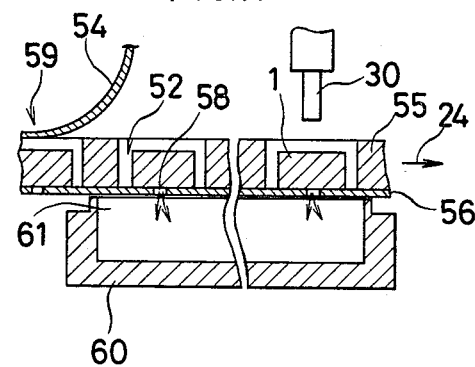
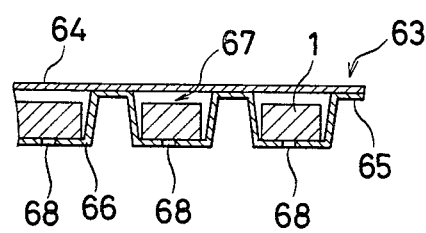
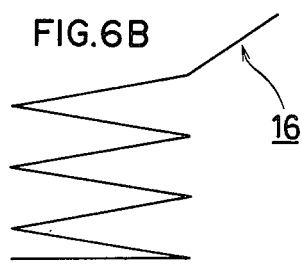

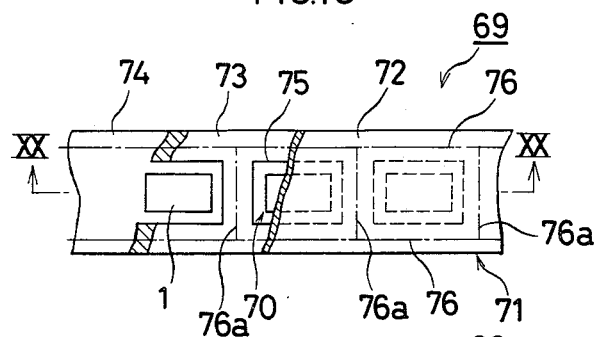
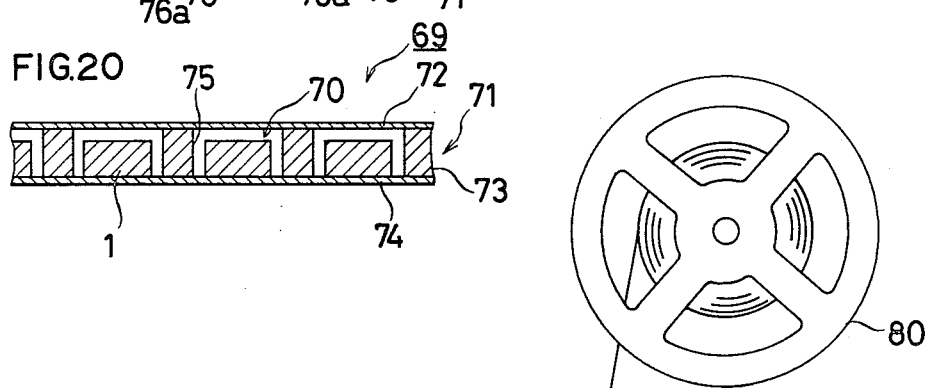
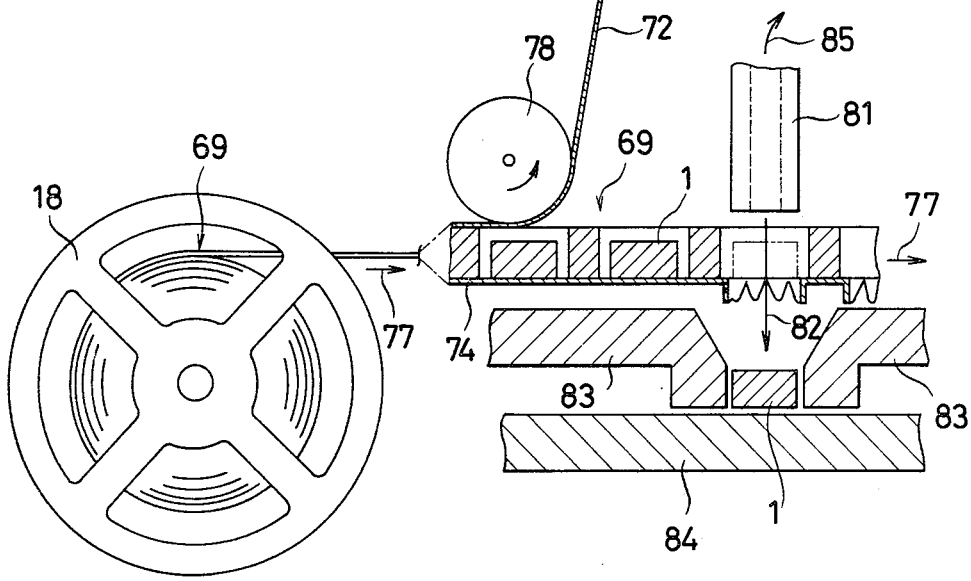

CHIP-LIKE ELECTRONIC COMPONENT SERIES AND METHOD FOR SUPPLYING CHIP-LIKE ELECTRONIC COMPONENTS

BACKGROUND OF THE INVENTION

1. Field of the Invention

The present invention relates to a chip-like electronic component series and a method for supplying chip-like electronic components using such series. More specifically, the present invention relates to such chip-like electronic component series carrying chip-like electronic components so as to be readily mounted on a print circuit board and the like, and a method for supplying chip-like electronic components on a print circuit board and the like using such series.

2. Description of the Prior Art

Conventionally, most electronic components comprise lead wires. However, the recent trend of various types of electronic devices is toward very thin shaped implementation or miniaturization. In order to cope with the above described trend, improvements have been made in various aspects of electronic devices and such improvements have expanded to such an extent that the number of the lead wires of the electronic components should be as small as possible. Chip-like electronic components having no lead wires may be advantageously utilized in such an environment.

FIG. 1 is an enlarged perspective view of a chip-like electronic component of the type to which the present invention is applicable. The chip-like electronic component 1 shown may be a chip-like capacitor, resistor or the like. The chip-like electronic component 1 comprises an electronic component body 2 and external connection electrodes 3 made of a conductive material such as silver or the like. In the case where the chip-like electronic component 1 is a capacitor, for example, the electronic component body 2 comprises a dielectric material. In the case where the chip-like electronic component 1 is a resistor, the electronic component body 2 comprises a resistive material.

Such a chip-like electronic component 1 is directly soldered onto a print circuit board of the like through these external connection electrodes, whereby the same is electrically and mechanically connected to the print circuit board and the like.

Supplying such chip-like electronic components for connection to a print circuit board, as described above, requires proper orientation of the components and hence has been performed by manual work or by means of a part feeder. Accordingly, disadvantages were encountered that manual work is complicated and nevertheless automation is difficult, while accuracy and reliability are low.

In order to avoid such disadvantages, therefore, a magazine type component receiver, a pallet type component receiver and the like have been proposed. FIG. 2 is a sectional view of a magazine type component receiver and FIG. 3 is a perspective view of a pallet type component receiver. FIG. 4 is a perspective view showing a magazine type component receiver different from that shown in FIG. 2.

Referring to FIG. 2, a magazine type component receiver is adapted to supply chip-like electronic components 1 by the use of a magazine 5 carrying a plurality of chip-like electronic components stacked in a cylindrical receiving member 4.

Referring to FIG. 3, a pallet type component receiver is adapted to supply chip-like electronic components 1 by the use of a pallet 8 including a flat receiving member 7 having a plurality of concavities 6 arranged in rows and columns and chip-like electronic components 1 carried within the respective concavities.

Referring to FIG. 4, a different magazine type component receiver is adapted to supply chip-like electronic components 1 by the use of a magazine including a receiving member 9 having an opened groove and a plurality of chip-like electronic components 1 arranged side by side and received in the groove.

These receiving members 4, 7 and 9 are made of aluminum, plastic or the like to be of a predetermined geometry, such as length, area and the like. However, the storage capacity of such a magazine 5 or 10 or a pallet 8 is relatively small, which necessitates frequent exchange of the magazine or pallet. Therefore, even if withdrawal of the chip-like electronic components 1 is automated, treatment of such magazine 5 or 10 or a pallet 8 becomes a difficult problem. Furthermore, in automatically supplying the chip-like electronic components 1 by using such magazine or pallet, it is necessary to directly push out or draw out the electronic components 1 and hence it is necessary to provide pushing out means, drawing out means, positioning means and the like. Furthermore, in case of a magazine type component receiver, since adjacent chip-like electronic components are in contact with each other, such contact could damage the electronic components 1.

SUMMARY OF THE INVENTION

The present invention has the object of providing a chip-like electronic component series and a method for supplying chip-like electronic components using such series, adapted to eliminate the above described various problems.

In summary, the present invention comprises an elastic tape-like receiving member having a plurality of receiving concavities distributed in the longitudinal direction. Chip-like electronic components are received one by one in the above described receiving concavities. The opening end surface of the receiving concavities in which the chip-like electronic components are received is covered with a cover member at one surface of the tape-like receiving member.

In a preferred embodiment of the present invention, the tape-like receiving member comprises two layers, i.e. a base plate formed with apertures for receiving chip-like electronic components and a further cover adhered to the other surface of the base plate for covering the apertures. By way of a further preferred embodiment of the present invention embodying the just described feature, the tape-like receiving member may be made of a single tape-like member having receiving concavities formed by molding.

In a further preferred embodiment of the present invention, a viscous adhesive agent is applied to the bottom surface of the receiving concavities so that the bottom surface may be suitably viscously adhesive. Alternatively, the second cover constituting the bottom surface of the receiving concavities may be formed of a viscous adhesive tape. By making the inner bottom surface of the receiving concavities viscous adhesive, chip-like electronic components may be tentatively retained through viscous adhesion and as a result the chip-like electronic components can be reliably and accurately positioned in the receiving concavities. The same advantages can be obtained by forming through holes for applying a suction to the bottom surface of the receiving concavities and by retaining the chip-like electronic components through a negative pressure caused by suction.

In still a further preferred embodiment of the present invention, the bottom surface of the receiving concavities may be formed to be readily broken upon depression. The chip-like electronic components as received therein are withdrawn therefrom through breakage of the bottom surface through the property of being readily broken upon depression.

In still a further preferred embodiment of the present invention, the bottom surface of the receiving concavities may be formed of an elastic material such as foamed rubber. The elasticity of the foamed rubber serves to effectively absorb the differences in the geometry of the chip-like electronic components when chip-like electronic components of different geometry are to be received in the receiving concavities of a predetermined geometry. The elasticity of the foamed rubber also serves to protect the chip-like electronic components from shock.

In still a further preferred embodiment of the present invention, a plurality of feeding perforations are formed on the tape-like receiving member distributed in the longitudinal direction. Such feeding perforations may be advantageously employed in case where chip-like electronic components are automatically supplied by utilizing a chip-like electronic component series.

Briefly described, the inventive method for supplying chip-like electronic components by the use of the inventive chip-like electronic component series comprises the step of transferring in succession the chip-like electronic components received in the receiving member by simultaneously moving the tape-like receiving member in the longitudinal direction. More specifically, by only moving the receiving member without directly feeding chip-like electronic components, the chip-like electronic components can be substantially brought into a chip removal position from which they can be successively withdrwn with efficiency for connection to other components, etc., and thus the components can be supplied onto a print circuit board, for example, from the above described position.

Accordingly, a principal object of the present invention is to provide a structure for receiving in a compact manner a multiple number of chip-like electronic components.

Another object of the present invention is to provide a chip-like electronic component series of a structure suited for an automatic supply of chip-like electronic components.

A further object of the present invention is to provide a chip-like electronic component series, wherein a casing thereof can be formed in direct association with fabrication of chip-like electronic components, whereby the fabrication steps prior to shipment are simplified.

Still a further object of the present invention is to provide a chip-like electronic component series which enables serial performance of the steps of fabricating a chip-like electronic component series, retaining chip-like electronic components and mounting the chip-like electronic components from the series onto a print circuit board, for example.

It is another object of the present invention to provide a chip-like electronic component series retaining chip-like electronic components the number of which can be directly observed, thereby to facilitate a process control.

It is a further object of the present invention to eliminate degradation and damage of chip-like electronic components, from the time a chip-like electronic component series retaining chip-like electronic components is fabricated until the chip-like electronic components of the series are supplied onto a print circuit board, for example.

It is still a further object of the present invention to provide a chip-like electronic component series of a structure suited for long term storage of chip-like electronic components, with the same sealed from the atmosphere.

It is still a further object of the present invention to provide a chip-like electronic component series, wherein chip-like electronic components can be always and stably received and retained in position, without displacement, dropping or the like.

It is still a further object of the present invention to provide a chip-like electronic component receiving member superior in versatility and adapted to receive chip-like electronic components of different geometry.

It is still a further object of the present invention to provide a method for efficiently supplying chip-like electronic components to a chip removal location.

These objects and other objects, features, aspects and advantages of the present invention will become more apparent from the following detailed description when taken in conjunction with the accompanying drawings.

BRIEF DESCRIPTION OF THE DRAWINGS

FIG. 1 is an enlarged perspective view of a chip-like electronic component;

FIG. 2 is a sectional view depicting a magazine type electronic component receiver by way of a prior art device of interest to the present invention;

FIG. 3 is a perspective view for depicting a pallet type electronic component receiver by way of a prior art device of interest to the present invention;

FIG. 4 is a perspective view depicting another magazine type electronic component receiver by way of a further prior art device of interest to the present invention;

FIGS. 5A to 5E are perspective views showing the inventive chip-like component series at various fabricating steps;

FIG. 6A is a perspective view showing an electronic component series as rolled, obtained by the fabricating process shown in FIGS. 5A to 5E;

FIG. 6B is a view showing an electronic component series obtained by the fabrication steps shown in FIGS. 5A to 5E and folded in a zigzag fashion;

FIG. 7 is a view of an electronic component supplying apparatus for depicting one embodiment of the inventive method for supplying chip-like electronic components;

FIG. 8 is a sectional view for depicting another embodiment of the inventive chip-like electronic component series;

FIG. 9 is a longitudinal sectional view depicting a further embodiment of the inventive chip-like electronic component series;

FIG. 10 is a longitudinal sectional view depicting still a further embodiment of the present invention;

FIGS. 11 and 12 are views for depicting still a further embodiment of the inventive chip-like electronic component series, wherein FIG. 11 is a longitudinal sectional view showing a portion of a receiving member and FIG. 12 is a longitudinal sectional view showing the FIG. 11 receiver with chip-like electronic components of different geometry received therein;

FIGS. 13 and 14 are views for depicting still a further embodiment of the inventive chip-like electronic component series, wherein FIG. 13 is a plan view showing a portion of the chip-like electronic component series and FIG. 14 is a sectional view taken along the line XIV—XIV shown in FIG. 13;

FIG. 15 is a view showing a portion of an apparatus for supplying the chip-like electronic components by the use of the chip-like electronic component series shown in FIGS. 13 and 14;

FIG. 16 is a perspective view showing a sucking chamber shown in part in FIG. 15;

FIG. 17 is a diagrammatic sectional view showing in an enlarged manner a major portion of FIG. 15;

FIG. 18 is a sectional view showing an embodiment correponding to a modification of the embodiment shown in FIGS. 13 and 14;

FIGS. 19 and 20 are views for depicting still a further embodiment of the inventive chip-like electronic component series, wherein FIG. 19 is a plan view of a portion of the chip-like electronic component series and FIG. 20 is a sectional view taken along the line XX—XX shown in FIG. 19; and FIG. 21 is a view of an electronic component supplying apparatus for depicting an embodiment of the inventive method for supplying the chip-like electronic components by the use of the chip-like electronic component series shown in FIGS. 19 and 20.

DESCRIPTION OF THE PREFERRED EMBODIMENTS

FIGS. 5A to 5E show perspective views of the inventive chip-like electronic component series at several stages of the manufacturing process. FIG. 6A is a perspective view of a roll of the resultant electronic component series. FIG. 6B is a view showing the resultant electronic component series folded in a zigzag fashion.

The chip-like electronic component series shown comprises a tape member 11 made of paper, plastic, metal such as iron or aluminum, or rubber (FIG. 5A). Preferably, the tape 11 is made of a flexible material which is readily rolled. The tape 11 is formed with a plurality of apertures 12 arranged in the longitudinal direction thereof (FIG. 5B). (Throughout the specification and claims, both "aperture" and "cavity" are intended to include both through-holes and recesses.) The plurality of apertures 12 are formed to be independent of each other and to be equipped. The apertures 12 are formed in the tape 11, by punching the same, for example. The tape 11 may be formed with a plurality of feeding perforations 13 at equal intervals in association with the arrangement pitch of the apertures 12. The feeding perforations 13 may be formed by the same means and at the same time as formation of the above described apertures 12. As a result, a positional relation of the apertures 12 and the perforations 13 and accuracy thereof can be much enhanced. The feeding perforations 13 are used to feed the tape 11 in processing the tape 11 and automatically mounting the electronic components onto the tape 11, as to be described subsequently.

A cover sheet 14 of a thin film is adhered to one surface of the tape 11 (FIG. 5C). The cover sheet 14 constitutes a cover for one opening of each of the apertures 12 and therefore is provided only to cover the apertures 12 and not to cover the feeding perforations 13. Adhesion of the cover sheet 14 may be performed by superposing a thin film of plastic on the surface of the tape 11 and by heating the same to be fused to adhesion, as is referred to as a heat seal method, but adhesion may be conveniently performed by using an adhesive agent. However, that care should be taken so the chip-like electronic components received within the apertures 12 may not be adhered to the cover sheet 14. In thermally sealing the cover sheet 14, it is not necessary to fuse the whole area of the cover sheet 14 but it is sufficient to locally heat and fuse the cover sheet so as to cover the apertures 12. For example, only a portion in the vicinity of both side faces of the tape 11 may be locally heated.

The chip-like electronic components 1 are placed one by one within the apertures 12, one opening of which has been covered with the cover sheet 14, while the orientation of the components 1 is properly determined (FIG. 5D).

Another thin film cover sheet 15 is also adhered to the other surface of the tape 11 in which the electronic components 1 have been placed (FIG. 5E). The cover sheet 15 is formed to constitute a cover of the other surface opening of the apertures 12 and hence should be formed not to cover the feeding perforations 13. Since the cover sheet 15 is similar to the above described cover sheet 14, any further detailed description thereof is omitted.

The inventive chip-like electronic component series 16 is structured in the above described manner. The chip-like electronic component series 16 is then spirally wound around a suitable core 17, as shown in FIG. 6A, for example.

As shown in FIG. 7 to be described subsequently, a reel 18 is prepared and the chip-like electronic component series 16 is spirally wound therearound.

Alternatively, as shown in FIG. 6B, the chip-like electronic component series 16, i.e. the tape 11 may be folded alternately at a suitable length in a zigzag fashion so as to be alternately layered.

According to the chip-like electronic component series 16 thus obtained, a multiplicity of chip-like electronic components 1 can be received in a compact manner and such chip-like electronic component series thus obtained as such can be subjected to shipment and loading in an automatic mounting apparatus. The longer the length of the tape 11 is selected, the more the chip-like electronic components can be received. As a result, one exchange of the chip-like electronic component series 16 thus obtained can establish a state of supplying the components for a longer period of time.

In actually supplying the chip-like electronic components 1 onto an automatic mounting apparatus by utilizing an electronic component series 16 thus structured, the tape is in succession fed by using the feeding perforations 13, while one of the cover sheets 14 and 15 is stripped from the tape 11 so that the chip-like electronic components 1 are in succession withdrawn.

FIG. 7 is an outline view of a supply apparatus for explaining one embodiment of the inventive method for supplying the chip-like electronic components to a chip removal location. The chip-like electronic component series 16 structured as described above is rolled in a roll shape on a component reel 18 rotatively supported. The chip-like electronic component series yielded in the arrow 19 direction from the reel 18 is guided by a guide 20 and is fed to a conveying device 21. The conveying device 21 comprises an intermittently operated belt conveyor 22, which is provided on the peripheral surface thereof with a plurality of equispaced protrusions 23. The protrusions 23 are adapted such that the same fit into the feeding perforations 13 (FIG. 5E) formed on the chip-like electronic component to a chip removal location series 16, whereby the chip-like electronic component series 16 is assuredly transferred in the arrow 24 direction.

Meanwhile, although in the foregoing description an engaging relation of the protrusions 23 and the feeding perforations 13 was utilized for the purpose of transferring the chip-like electronic component series 16, such scheme need not be employed. Alternatively a pair of feeding rollers, not shown, may be provided so as to sandwich the chip-like electronic component series 16 from both surfaces, thereby to transfer the same. In such a case, the feeding perforations may be dispensed with and preferably serration for preventing slippage may be formed on the feeding rollers.

In FIG. 7, a pusher member 26 is provided so as to be urged downward by means of a spring 25 and so as to be faced to the upper surface of the belt conveyor 22. The pusher member 26 is provided to make sure that the protrusions 23 fit into the feeding perforations 13. As described previously, one sheet cover 15 has been formed on the upper surface of the chip-like electronic component series 16 (FIG. 5E) and a drawing up roller 27 is provided at a suitable position on the belt conveyor 22 for the purpose of forcibly stripping the cover sheet 15 from the chip-like electronic component series 16 and drawing up the same. To that end, the cover sheet 15 is set around the drawing up roller 27 so that the same is drawn up in the arrow 28 direction and is wound on a winding reel 29 provided above. The winding reel 29 is driven by a suitable rotating force, so that the cover sheet 15 is forcibly stripped from the chip-like electronic component series 16 by the force. A sucking chunk 30 is provided in the vicinity of the above described drawing up roller 27. The sucking chunk 30 is adapted to suck by vacuum the chip-like electronic components 1 to retain the same and to be moved repetitively upward, leftward/rightward and downward, thereby to supply the chip-like electronic components 1 onto a print circuit board (not shown), for example. The chip-like electronic component series 16 from which the chip-like electronic components 1 have been picked up is fed through a guide 31 in the arrow direction.

Thus, the inventive method for supplying the chip-like electronic components is performed by feeding the tape 11 of the chip-like electronic component series 16 in the longitudinal direction, thereby to transfer the chip-like electronic components 1. Then the chip-like electronic components 1 thus conveyed to a prescribed position are in succession drawn out with stripping or removing the cover sheet 15 from the tape 11 and are mounted onto a print circuit board or the like.

FIG. 8 is a sectional view, taken along the width direction, of another embodiment of the inventive chip-like electronic component series. The chip-like electronic component series shown comprises a tape 35 having two series or columns of apertures 33 and 34. The tape 35 is covered with cover sheets 36 and 37 at both surfaces, as done in the above described embodiment, and is also formed of feeding perforations 38. The embodiment shown can carry two times the number of the chip-like electronic components 1 in a given length of the tape 35. Thus, it will be appreciated that the apertures may be provided in two or more series or columns.

The above described embodiments are specific examples of the present invention and should not be taken to limit the present invention. For example, the feeding perforations being formed on the tape may be formed in two or more rows. Instead, the feeding perforations may be replaced by notches or recesses formed equispaced at the side edge of the tape. Although in the above described embodiments the arrangement pitch of the feeding perforations was selected to be the same as that of the apertures for receiving the electronic components, this should neither be construed by way of limitation, inasmuch as the arrangement pitch of the feeding perforations may be as large as two times the arrangement pitch of the apertures for receiving the electronic components. Similarly, the positions of the feeding perforations may be arbitrarily selected with respect to the positions of the apertures for receiving the electronic components. Although in the above described embodiments the cover sheets adhered onto both surfaces of the tape were described not to cover the feeding perforations, it is sufficient if the feeding perforations are not covered when the tape is subjectd to a feeding operation by the use of the feeding perforations at the least and it is not necessarily required not to cover the feeding perforations in a fabricating process. In other words, even if the feeding perforations had been covered in the fabricatihg process, it is sufficient to break the cover at the feeding perforations by means of a hook, a puncher or the like.

In the foregoing depiction in conjunction with FIGS. 5C and 5D, it was described that the cover sheet 14 should be adapted such that the same is not be in contact with the chip-like electronic components. However, this is not intended to rule out light contact of the cover sheet 14 with the chip-like electronic components 1. For example, the above described cover sheet 14 may be a viscous adhesive tape. More specifically, a viscous adhesive tape may be used to form the bottom surface of the apertures 12 of the tape 11, such that the adhesive surface of the viscous adhesive tape may be an inner side, whereby the chip-like electronic components 1 received within the apertures 12 may be adhered thereto and retained thereby. The adhesive power or viscosity achieved by the adhesive surface of the viscous adhesive tape may be such as to temporarily retain chip-like electronic components 1 of a very light weight and need not be very large. In supplying the components, the chip-like electronic components 1 as adhesively retained onto the viscous adhesive tape are withdrawn against the adhesive power and therefore for facility of such withdrawal the adhesive power should be properly determined.

If the chip-like electronic components are adapted to be carried within the apertures of the tape with the same adhesively retained, as described in the foregoing, then it follows that the chip-like electronic components will be usually and stably positioned at prescribed positions. Accordingly, withdrawal and supply of the chip-like electronic components by the use of an automatic supplying apparatus, as shown in FIG. 7, could be performed with extreme accuracy. Referring to FIG. 7, without employing the above described adhesive property of the cover, the chip-like electronic components existing at the respective positions intermediate the drawing up roller 27 and the sucking chuck 30 would have been dropped out for some reasons, such as vibration, wind, and the like inasmuch as the upper cover sheet 15 has been removed; however, employment of the adhesive property of the tape eliminates such an inconvenient situation.

Several embodiments performing the similar effects will be described in the following.

FIG. 9 is a view showing a further embodiment of the present invention. The tape 39 is formed of a plurality of independent concavities 40 equispaced in the longitudinal direction of the tape 39. The inner bottom surface of the concavities 40 is coated with an adhesive agent or a viscous agent 41 or is a two-surface adhesive tape, so that the inner bottom surface may be an adhesive surface, whereby the electronic components 1 being received therein may be adhesively retained.

FIG. 10 is a view showing still a further embodiment of the present invention. A thin tape 42 is formed with a plurality of equispaced concavities 43 in the upper surface of the tape 42, while the inner bottom surface of the concavities 43 is provided with an adhesive agent or a viscous agent 44 or a two-surface adhesive tape is provided, so that the electronic components 1 may be adhesively retained therein.

It should be provided out that the above described embodiments shown in FIGS. 9 and 10 also disclose a different feature, apart from formation of the adhesive surface on the cover. More specifically, in case of the embodiment shown in FIGS. 5A to 5E those portions for receiving the chip-like electronic components 1 are formed defined by the apertures 12 of the tape 11 and one cover sheet 14, whereas in case of the embodiments shown in FIGS. 9 and 10 such receiving portions are formed on solely by the tape.

In case of the FIG. 9 embodiment formation of the concavities 40 having a bottom surface in the tape 39 provides those portions for receiving the chip-like electronic components 1. Thus, as compared with the embodiment shown in FIGS. 5A to 5E, one cover sheet 14 has been dispensed with. The tape 39 having such concavities 40 may be provided by molding a material such as plastic, rubber and the like or by pressing a sheet material of such as iron, aluminum or the like.

The FIG. 10 embodiment is provided with the concavities 43 for receiving the chip-like electronic components 1 by pressing concavities 43 into one surface of a thin tape material 42. As a result, one cover sheet 14 in case of the embodiment shown in FIGS. 5A to 5E can be dispensed with. The tape 42 having the concavities 43 can be provided by pressing a thin sheet material of such as paper, plastic, metal such as iron, aluminum or the like, or rubber or the like.

It should be pointed out that FIGS. 9 and 10 have been illustrated, with the cover sheet closing the opening surface of the concavities 40 or 43 omitted. It is a matter of course that the cover sheet can be formed in the same manner as done in the embodiment shown in FIGS. 5A to 5E.

FIGS. 11 and 12 are views for explaining further embodiments of the inventive chip-like electronic component series, wherein FIG. 11 is a sectional view showing a portion of the receiving member and FIG. 12 is a sectional view showing the receiving member, with chip-like electronic components of different geometry received therein. The receiving member 45 substantially comprises four layers, i.e. an upper tape 46, a base plate 47, a sponge sheet 48 and a lower tape 49, as layered and adhered to each other. Inclusion of the sponge sheet 48 is a characteristic feature of the embodiment shown and the sponge sheet 48 may be made of a sponge like soft foamed resin. The upper tape 46, the base plate 47 and the lower tape 49 may be made of flexible materials, such as sheet materials of such as paper, resin, metal or the like. The base plate 47 is formed with a plurality of apertures 50 as distributed in the longitudinal direction, so that a closed space 51 is defined by the aperture in the base plate 47, the upper tape 46 and the sponge sheet 48. The closed space 51 is used to receive a chip-like electronic component.

As better shown in FIG. 12, the closed receiving spaces 51 formed in the receiving member 45 are used to receive chip-like electronic components 1a, 1b, 1c and so on of different geometry, while the orientation thereof is properly determined. In the embodiment shown, the chip-like electronic component 1b is thicker than the chip-like electronic component 1a and the chip-like electronic component 1c is much thicker than the chip-like electronic component 1b. Since the differences of the geometry such as the thickness of these chip-like electronic components 1a, 1b, 1c and so on are absorbed by virtue of construction of the sponge sheet 48, such chip-like electronic components 1a, 1b, 1c and so on of different geometry can be received within the closed receiving spaces 51 of only one kind of receiving member 45.

Generally such chip-like electronic components are very small sized, the thickness of the components being approximately 1 mm. Therefore, the difference of the thicknesses between these chip-like electronic components of different geometry are approximately 0.2 mm at the most. Accordingly, although the differences of the different thicknesses of these components are absorbed by virtue of construction of the sponge sheet 48, the difference absorbing capacity of the sponge sheet 48 need not be so large and therefore the sponge sheet 48 need not be so thick. It is a matter of course that electronic components of different kinds and of different thickness, etc., may be received in succession in one receiving member 45.

Although in the above described embodiment the sponge sheet 48 was formed to cover the whole surface of the lower tape 49, so that the lower tape 49 was adhered to the base plate 47 through the sponge sheet 48, it is pointed out that it is sufficient to form the sponge sheet 48 as one surface of the above described closed receiving space 51 only. Alternatively, the receiving member 45 may be structured to comprise the three layers of the upper tape 46, the base plate 47 and the sponge sheet 48, while the lower tape 49 is omitted.

According to the above described embodiment, the chip-like electronic components are received in the receiving member, with each of the components individually protected by a soft sponge rubber. As a result, degradation and damage of the chip-like electronic components can be avoided not only in the shipment but in the manufacturing process up to the mounting step. Furthermore, formation of a soft sponge rubber in a given surface in the closed receiving space formed in the receiving member makes it possible to carry chip-like electronic components of different geometry and hence of different kinds in one type of receiving member. Thus, a receiving member for receiving chip-like electronic components of excellent versatility is provided.

FIGS. 13 and 14 are views for explaining still a further embodiment of the inventive chip-like electronic component series, wherein FIG. 13 is a plan view of a portion of the chip-like electronic component series and FIG. 14 is a sectional view taken along the line XIV—XIV in FIG. 13. The embodiment shown comprises a receiving member 53 formed with a plurality of receiving concavities 52 for receiving chip-like electronic components 1 one by one as distributed in the longitudinal direction of the receiving member 53, comprising three layers, i.e. an upper tape 54, a base plate 55 and a lower tape 56. The respective layers may be made of flexible materials, such as paper, resin, metal or the like. These three layers 54, 55 and 56 are layered and adhered to each other by an adhesive agent. The base plate 55 is formed with a plurality of rectangular apertures 57 as distributed in the longitudinal direction and the above described receiving concavities 52 are defined by the apertures 57 of the base plate 55 and the upper and lower tapes 54 and 56. The chip-like electronic components 1 are received within the receiving concavities 52 of the receiving member 53, while the orientation of them is properly determined.

The embodiment shown is characterized by formation of a sucking through-hole 58 formed at a portion of the lower tape 56 corresponding to the bottom surface of each of the receiving concavities 52. The geometry or the size and shape of the sucking through-hole 58 is selected to prevent the chip-like electronic component 1 received in the receiving concavity 52 from dropping therethrough. The function of the sucking through-hole 58 will become apparent from a description of a method for supplying the chip-like electronic components, as will be described subsequently.

A chip-like electronic component series 59 is formed in the above described manner. FIG. 15 is a diagrammatic view showing a portion of an apparatus for supplying chip-like electronic components 11 by the use of the above described chip-like electronic component series. FIG. 15 shows a portion corresponding to the conveying device 21 described previously in conjunction with FIG. 7. FIG. 16 is a perspective view showing a sucking chamber 60 which was briefly illustrated at a portion of FIG. 15. FIG. 17 is a sectional view showing a major portion of FIG. 15 in an enlarged manner. In FIG. 15 and so on like portions have been denoted by like reference numerals and a duplicate description thereof will be omitted.

The chip-like electronic component series 59 as structured as shown in FIGS. 13 and 14 is conveyed by the conveying device 21. Immediately after the drawing up roller 27 provided midway the transfer path, the sucking chamber 60 is provided to extend in the longitudinal direction of the transfer path for a relatively large length. A sucking chuck 30 is provided to be faced to the transfer path in the vicinity of the end of the sucking chamber 60.

The sucking chamber 60 is formed with a sucking aperture 61 extending for a given length, as shown in FIG. 16, and is connected to a negative pressure connector 62. Accordingly, when the negative pressure connector 62 is connected to a vacuum pump, not shown, air flow into the sucking aperture 61.

Referring to FIG. 17, the sucking aperture 61 of the sucking chamber 60 is faced to the sucking through-hole 58 formed at the lower tape 56 of the chip-like electronic component series 59 being transferred in the arrow 24 direction. The sucking aperture 61 is formed to cover at least the range from the sucking through-hole 58 of the receiving concavity following immediately after a point where the upper tape 54 has just stripped to the sucking through-hole 58 in the receiving concavity 52 facing the sucking chuck 30. With such a structure, at least a portion of the air as sucked from the sucking aperture 61 must have passed through the receiving concavity 52 and the sucking through-hole 58, with the result that the chip-like electronic component 1 in the receiving concavity 51 of the range as covered by the sucking aperture 61 is kept by suction at the bottom surface of the receiving concavity 51. Accordingly, even after the upper tape 54 has been stripped in such a situation, the chip-like electronic component 1 is advantageously prevented from coming outside due to an external influence such as vibration or the like.

The sucking chuck 30 repeats vertical and lateral movement, whereby the chip-like electronic components 1 are picked up in succession one by one and are placed on a print circuit board, not shown, or the like. The sucking chuck 30 is adapted such that the chip-like electronic component 1 are vacuum sucked relatively hard, so that the same are carried to a prescribed position with the same as vacuum retained.

Although in the above described embodiment suction is applied via the sucking through-hole 58 after the upper tape 54 is stripped so that the suction advantageously affects the receiving concavity 52, alternatively the upper tape 54 may be formed with a suitable air aperture. The suction is then applied to the receiving concavity 52 without regard to, i.e. even before, the stripping of the upper tape 54. Alternatively, the upper tape 54 may not be necessarily fixed to the base plate 53 in a sealing manner but a gap may be formed at a fixing portion between the upper tape 54 and the base plate 55 by forming grooves on the upper surface of the base plate 55, for example.

FIG. 18 is a sectional view of a further embodiment which corresponds to a modification of the embodiment shown in FIGS. 13 and 14. The receiving member 63 shown comprises two layers, i.e. an upper tape 64 and a lower tape 65. The upper and lower tapes 64 and 65 are made of a flexible material, such as paper, resin, metal and the like. The lower tape 65 is formed with a swelled portion 66 fabricated by the use of a press or a hot press, whereby a receiving concavity 67 is formed between the swelled portion 66 and the upper tape 64. A sucking through-hole 68 is formed at the lower surface of the swelled portion 66 corresponding to the bottom surface of the receiving concavity 67. It is pointed out that the sucking through-hole 68 performs substantially the same function as that of the sucking through-hole 58 of the embodiment shown in FIGS. 13 and 14.

FIGS. 19 and 20 are views for explaining still a further embodiment of the inventive chip-like electronic component series, wherein FIG. 19 is a plan view showing a portion of the chip-like electronic component series and FIG. 20 is a sectional view taken along the line XX—XX in FIG. 19. The chip-like electronic component series 69 comprises a flexible receiving member 71 having a plurality of receiving concavities 70. The receiving member 71 comprises three layers, i.e. an upper tape 72, a base plate 73 and a lower tape 74. The upper tape 72 and the base plate 73 are made of any flexible material such as paper, resin, metal or the like. The lower tape 74 is preferably made of an aluminum foil for the reason to be described subsequently. The base plate 73 is formed with a plurality of apertures 75 distributed in the longitudinal direction, so that the receiving concavities 70 for receiving the chip-like electronic components 1 are formed as defined by the apertures 75 and the upper and the lower tapes 72 and 74 formed on both surfaces.

The chip-like electronic component series 69 receiving the chip-like electronic components 1 in the above described receiving concavities 70 is fabricated in the following manner. At the outset, the lower tape 74 is adhered to the base plate 73. Then the chip-like electronic components 1 are inserted into the apertures of the base plate 73 while the components are suitably oriented. Finally the upper tape 72 is adhered onto the upper surface of the base plate 73. Adhesion of the upper and lower tapes 72 and 74 to the base plate 73 is performed by the use of an adhesive agent, for example, in which the adhesive agent is preferably coated not on the whole surface but locally along the lines 76 shown in FIG. 19 and more preferably also along the lines 76a in FIG. 19. Even in case of relying upon thermal adhesion without using an adhesive agent, preferably heating is made only along the lines 76 and 76a. The reason is that in the step of adhering the upper tape 72 onto the base plate 73 the chip-like electronic components 1 have been already inserted into the receiving concavities 70 and therefore it is required to minimize any influence being exerted upon the chip-like electronic components 1 by virtue of such adhering process.

Although in the above described embodiment an aluminum foil was employed as the lower tape 74, it was aimed to make skillful use of the property of an aluminum foil being readily broken upon depression. Therefore, the lower tape 74 may be made of other materials such as paper sheet having a similar property. Although a resin material has an extensibility and is of the property being less readily broken, such material can also be advantageously used as the lower tape 74 by forming perforations in advance so as to be readily broken.

Although in the above described embodiment the receiving concavities 70 were formed as defined by the apertures 75 of the base plate 73, the upper tape 72 and the lower tape 74, the base plate 73 and the lower tape 74 may be made unitary, while only a portion corresponding to the lower tape may be made as thin or may be formed with perforations so as to be readily broken.

FIG. 21 is a view showing an outline of a supply apparatus for explaining one embodiment in accordance with the inventive method for supplying the chip-like electronic components using the chip-like electronic component series shown in FIGS. 19 and 20. It is pointed out that FIG. 21 is illustrated not to scale, so that a portion is shown as enlarged and in section. The chip-like electronic component series 69 described in conjunction with FIGS. 19 and 20 is wound in a roll and is mounted so as to be yieldable on a component reel 18 rotatably supported. The chip-like electronic component series 69 is intermittently conveyed in the arrow 77 direction by means of a suitable conveying device, not shown. The conveying device may comprise a belt conveyor or a pair of feed rollers for sandwiching the chip-like electronic component series 69, for example. In order to perform assured conveyance, the chip-like electronic component series 69 is formed of feeding perforations and protrusions are formed on the transfer surface of the conveying device so as to be engageable in succession with the feeding perforations of the chip-like electronic component series 69.

The chip-like electronic component series 69 is brought to be faced to a drawing up roller 78 midway of the transfer path in the arrow 77 direction, so that the drawing up roller 78 effectively strips the upper tape 72 from the chip-like electronic component series 69. More specifically, the upper tape 72 is set around the drawing up roller 78 so that the upper tape 72 is drawn up in the arrow 79 direction, while the same is forcibly wound about a winding reel 80. The winding reel 80 is drivingly rotated, so that the upper tape 72 is stripped from the chip-like electronic component series 69 by virtue of the driving force. A pusher 81 is provided in the vicinity of the drawing up roller 78. The pusher 81 is provided to reciprocate upward and downward, so that a chip-like electronic component 1 is depressed downward during the arrow 82 downward directional movement of the pusher 81 until the lower tape 74 is broken and the chip-like electronic component 1 is pushed downward. The chip-like electronic component 1 as thus pushed downward is guided by a guiding member 83 to be placed on a suitable print circuit board 84.

In such a process for supplying the chip-like electronic components 1 by means of the pusher 81, preferably the lower end surface of the pusher 81 contacts the upper end surface of the chip-like electronic component 1 by as broad an area as possible in order to prevent inclination of the chip-like electronic component 1. More specifically, the pusher 81 is formed in a cylindrical shape and the chip-like electronic component 1 may be retained by vacuum during a supply period of the components 1 onto the print circuit board 84 by vacuum sucking, as indicated by the arrow 85, through the above described cylindrical shape. Such preferred embodiment makes it possible to supply the chip-like electronic components 1 with accuracy and reliability.

In the foregoing various embodiments of the inventive chip-like electronic component series were described and then various methods for supplying the chip-like electronic components in accordance with the respective embodiments of the component series were also described. In such supplying methods, an approach to employ a chip-like electronic component series having feeding perforations, another approach to employ a pair of feeding rollers and the like were disclosed for the purpose of feeding the chip-like electronic component series; however, it will be appreciated that the feeding perforations can be dispensed with. The reason is that the original receiving apertures of the base plate which were used to define the receiving concavities together with the upper and lower tapes can also be advantageously utilized as feeding apertures, after the upper tape is stripped and the chip-like electronic components are removed. Such utilization of the original receiving apertures for receiving the chip-like electronic components as feeding apertures totally eliminates any problems caused by misregistration between the feeding apertures proper and the receiving apertures, thereby to enhance feeding accuracy of the electronic component series.

Alternatively, in case of such embodiments as shown in FIGS. 10 and 18 wherein the electronic component series has notches or indentations in one external surface, such notches or identations can also be advantageously used as feed engaging means.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-like electronic component series, comprising;
   a flexible tape extending in a longitudinal direction and having a plurality of cavities formed therein and distributed along said tape in said longitudinal direction;
   a plurality of chip-like electronic components received in respective ones of said cavities; and
   cover means for covering said cavities to retain said components therein;
   each of said cavities having a quadrilateral first open end;
   each of said components having first and second opposite ends and having first and second electrodes formed thereon, respectively, and having a cross section smaller than said first open end of each said cavity, and the shape of each said component cooperating with that of its respective said cavity to cause said component to be received in its respective said cavity with a predetermined orientation, and to prevent said component from rotating therein; and
   said cover means being adhered to said tape and having a tensile strength that is greater than the adhesion between said cover means and said tape.

2. A chip-like electronic component series in accordance with claim 1, wherein said tape has a thickness as measured in a direction orthogonal to said longitudinal direction and wherein said cavities extend through the entire thickness of said tape, whereby each of said cavities has first and second open ends, and wherein said cover means comprises first and second covers for covering said first and second open ends of said cavities, respectively.

3. A chip-like electronic component series in accordance with claim 1, wherein said tape comprises a unitary tape in which said cavities are formed by molding.

4. A chip-like electronic component series in accordance with claim 1, wherein each of said cavities has an inner bottom surface that is adhesive.

5. A chip-like electronic component series in accordance with claim 2, wherein said second cover comprises a sheet of material having one surface adhesive, said sheet being adhered to said tape with said adhesive surface facing said tape.

6. A chip-like electronic component series in accordance with claim 1, wherein each of said cavities has a bottom surface that can be readily broken.

7. A chip-like elecronic component series in accordance with claim 1, wherein each of said cavities has an inner bottom surface comprising an elastic layer.

8. A chip-like electronic component series in accordance with claim 2 or 6 wherein each of said cavities has a bottom surface having a through-hole therein.

9. A chip-like electronic component series in accordance with claim 1, wherein said tape has a plurality of feeding perforations therein.

10. A chip-like electronic component series in accordance with claim 1, wherein said cavities are arranged in at least two rows each extending along said longitudinal direction.

11. A method for supplying chip-like electronic components, comprising the steps of:
    preparing a chip-like electronic component series comprising a flexible means having a longitudinal direction of extension and having a plurality of cavities therein that are distributed along said longitudinal direction and that each contain a chip-like electronic component having first and second opposite ends and having first and second electrodes formed on said first and second opposite ends thereof, respectively, and cover means for closing said cavities to retain said components therein; each said cavity having an open end covered by said cover means, and the shape of said open end of each said cavity cooperating with the shape of the respective said component contained therein to cause said component to be contained therein irrotatably and with a predetermined orientation;
    moving said chip-like electronic component series in said longitudinal direction to successively place each of said chip-like components at a chip removal location; and
    withdrawing each said chip-like electronic component from its respective cavity when said chip-like component is at said chip removal location.

12. A method for supplying chip-like electronic components in accordance with claim 11, further comprising the step of removing at least a portion of said cover means from said flexible means to expose each said component in succession prior to withdrawing said component.

13. A method for supplying chip-like electronic components in accordance with claim 11, wherein said step of preparing a chip-like electronic component series further comprises the step of rolling said chip-like electronic component series up along said longitudinal direction.

14. A method for supplying chip-like electronic components in accordance with claim 11, further including the step of folding said chip-like electronic component series at intervals and stacking it in a zigzag fashion before said chip-like electronic component series is moved in said longitudinal direction.

15. A method for supplying chip-like electronic components in accordance with claim 11, wherein said flexible means has a longitudinal row of feeding perforations therein and wherein said step of moving said chip-like electronic component series comprises the step of sequentially engaging said feeding perforations.

16. A method for supplying chip-like electronic components in accordance with claim 11, wherein said step of moving said chip-like electronic component series comprises the step of sequentially engaging at least some of said cavities after said chip-like electronic components have been withdrawn therefrom.

17. A method for supplying chip-like electronic components in accordance with claim 11, wherein said step of preparing a chip-like electronic component series comprises the steps of:
    preparing a thin longitudinal sheet having first and second major opposing surfaces; and
    exerting pressure on said first major surface of said thin sheet toward said second major surface to form said cavities such that each has a convex outer surface.

18. The method for supplying chip-like electronic components in accordance with claim 17, wherein said step of moving said chip-like electronic component series comprises the step of sequentially engaging said convex outer surfaces of said cavities.

19. A method for supplying chip-like electronic components in accordance with claim 11, wherein said step of withdrawing said chip-like electronic components comprises the step of pressing said chip-like electronic components against and through said bottom surfaces of said cavities.

20. A method for supplying chip-like electronic components in accordance with claim 11, wherein said step of withdrawing said chip-like electronic components comprises the step of drawing said chip-like electronic components out of said cavities.

21. A method for supplying chip-like electronic components in accordance with claim 20, wherein each of said cavities has a bottom surface to which a respective one of said chip-like electronic components is adhered.

22. A method for supplying chip-like electronic components in accordance with claim 20, wherein each of said cavities has a bottom surface having a respective through-hole formed therein and wherein suction is applied through said through-hole and wherein said step of drawing said chip-like electronic components is performed against the force exerted by said suction applied through said additional apertures.

23. A method for supplying chip-like electronic components in accordance with claim 20, wherein said suction is applied by means of a suction chuck.

24. A method for supplying chip-like electronic components in accordance with claim 11, wherein said open end of each said cavity is hexagonal.

25. A method for supplying chip-like electronic components in accordance with claim 11, wherein said open end of each said cavity is quadrilateral.

26. A chip-like electronic component series, comprising:
- a flexible tape extending in a longitudinal direction and having a thickness as measured in a direction orthogonal to said longitudinal direction, said tape having a plurality of cavities formed therein, distributed along said tape in said longitudinal direction and extending through the entire thickness of said tape, such that each of said cavities has first and second respective open ends;
- a plurality of chip-like electronic components, each received in a respective one of said cavities; and
- first and second cover means for covering said first and second open ends of said cavities, respectively, to retain said components therein;
- each of said cavities defining a hexahedral space;
- each of said components having first and second opposite ends and having first and second electrodes formed on said first and second opposite ends thereof, respectively, and having a cross section smaller than said first open end of each said cavity, and the shape of each said component cooperating with that of its respective said cavity to cause said component to be received in its respective said cavity irrotatably and with a predetermined orientation;
- said first cover means being adhered to said tape and having a tensile strength that is greater than the adhesion between said first cover means and said tape.

* * * * *